US012362084B2

(12) United States Patent
Chung et al.

(10) Patent No.: US 12,362,084 B2
(45) Date of Patent: Jul. 15, 2025

(54) COIL STRUCTURE

(71) Applicant: CYNTEC CO., LTD., Hsinchu (TW)

(72) Inventors: Min-Feng Chung, Taichung (TW);
Ching Hsiang Yu, New Taipei (TW);
Kuan Yu Chiu, Miaoli County (TW);
Yu-Hsin Lin, Taipei (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 18/241,916

(22) Filed: Sep. 4, 2023

(65) Prior Publication Data

US 2023/0411057 A1     Dec. 21, 2023

Related U.S. Application Data

(63) Continuation of application No. 16/821,014, filed on Mar. 17, 2020, now Pat. No. 11,791,079.

(60) Provisional application No. 62/822,051, filed on Mar. 22, 2019.

(51) Int. Cl.
| | | |
|---|---|---|
| *B23P 19/00* | (2006.01) | |
| *H01F 5/04* | (2006.01) | |
| *H01F 5/06* | (2006.01) | |
| *H01F 27/06* | (2006.01) | |
| *H01F 41/063* | (2016.01) | |
| *H01F 41/076* | (2016.01) | |
| *H05K 1/11* | (2006.01) | |
| *H05K 1/18* | (2006.01) | |
| *H05K 13/04* | (2006.01) | |

(52) U.S. Cl.
CPC .................. *H01F 5/06* (2013.01); *H01F 5/04* (2013.01); *H01F 27/06* (2013.01); *H01F 41/063* (2016.01); *H01F 41/076* (2016.01); *H05K 1/118* (2013.01); *H05K 1/182* (2013.01); *H01F 2027/065* (2013.01); *H05K 1/112* (2013.01); *H05K 2201/1003* (2013.01)

(58) Field of Classification Search
CPC ...... H01F 41/063; H01F 41/076; H01F 27/06; H01F 5/04; H01F 5/06; H01F 2027/065; H01F 27/2871; H05K 1/112; H05K 1/118; H05K 1/182; H05K 1/189; H05K 3/103; H05K 2201/0098; H05K 2201/086; H05K 2201/1003
See application file for complete search history.

(56) References Cited

U.S. PATENT DOCUMENTS

| | | | | |
|---|---|---|---|---|
| 6,700,066 | B1 * | 3/2004 | Kuo ..................... | H01R 9/0512 |
| | | | | 439/578 |
| 9,076,586 | B2 * | 7/2015 | Atsumi ................ | H01F 27/292 |
| 2020/0251277 | A1 * | 8/2020 | Lin ....................... | H01F 27/327 |

FOREIGN PATENT DOCUMENTS

JP      07222388 A  *  8/1995

* cited by examiner

*Primary Examiner* — Paul D Kim
(74) *Attorney, Agent, or Firm* — Min-Lee Teng

(57) ABSTRACT

A coil structure comprises a coil and a conductive terminal part, wherein the coil is formed by a conductive wire comprising a metal wire and at least one insulating layer encapsulating the metal wire, wherein a first terminal part of the metal wire is exposed from the at least one insulating layer, wherein a first portion of the conductive terminal part encapsulates the first terminal part of the metal wire and a second portion of the conductive terminal part extends from said first portion as an electrode for electrically connecting to an external circuit.

3 Claims, 19 Drawing Sheets

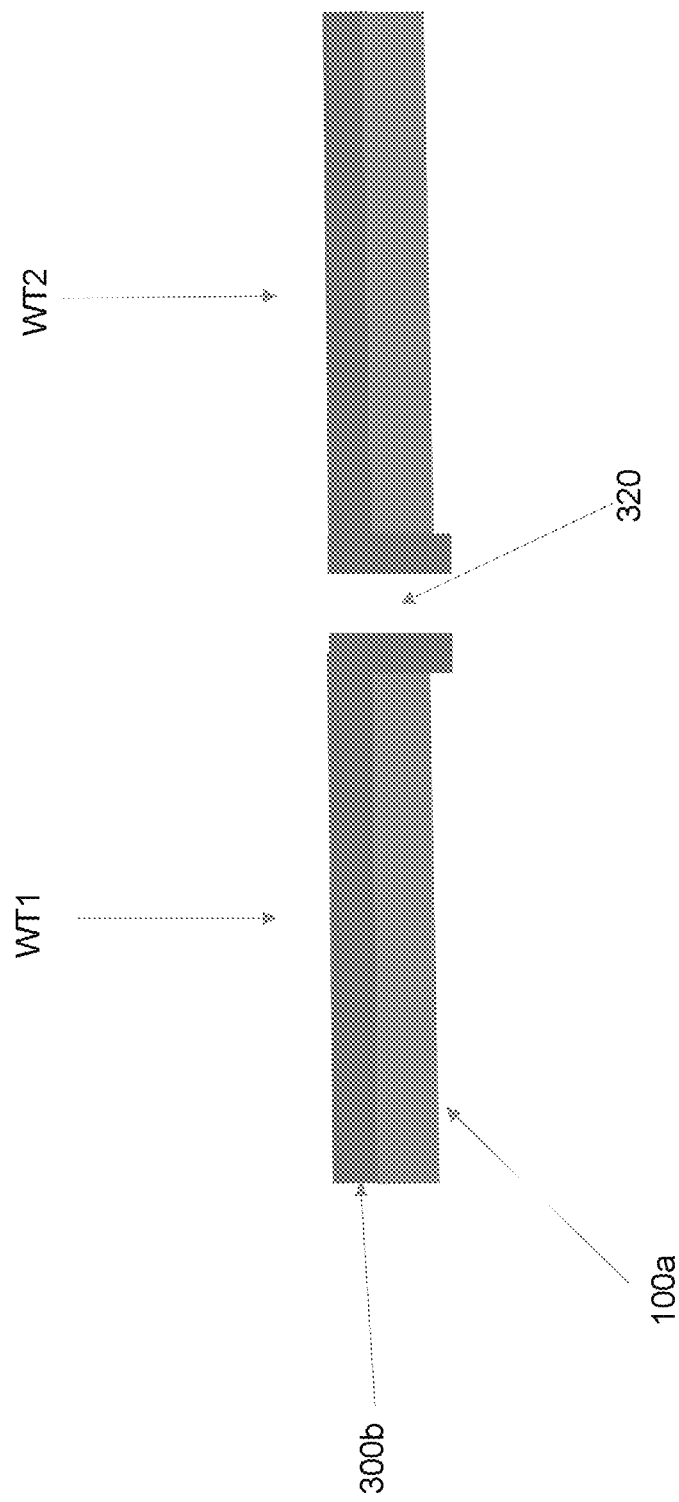

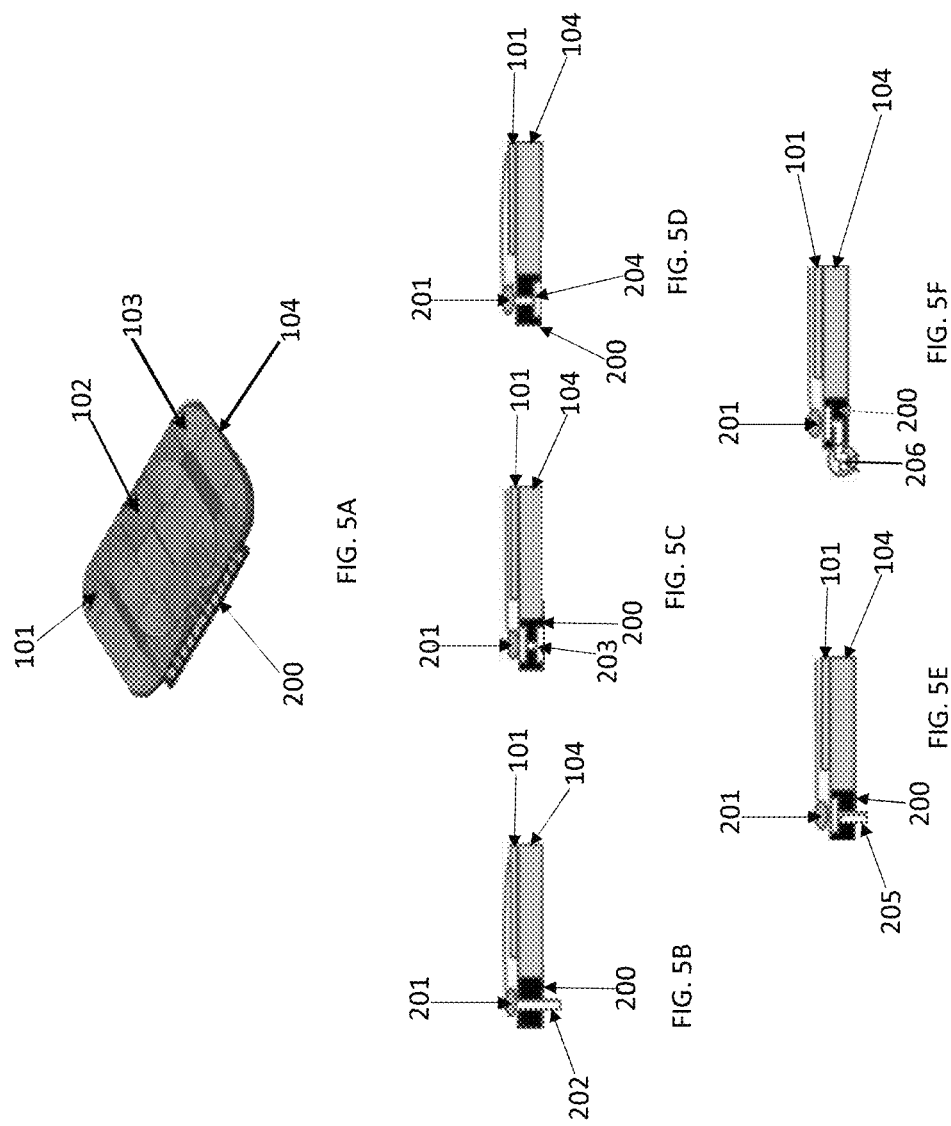

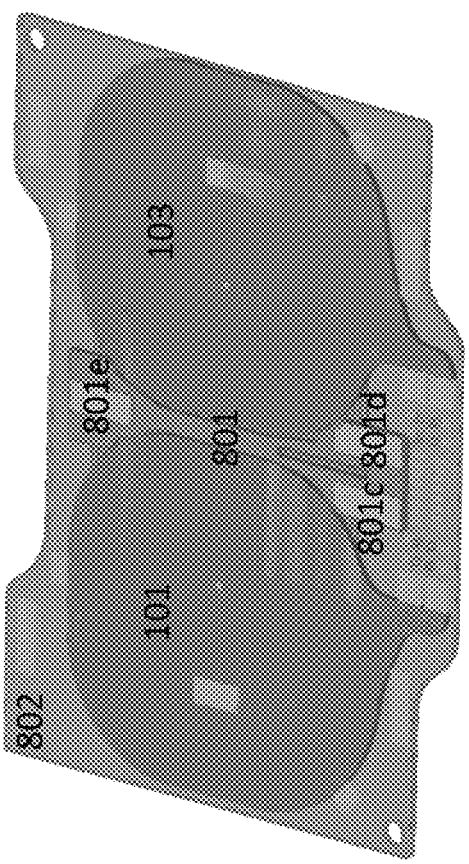
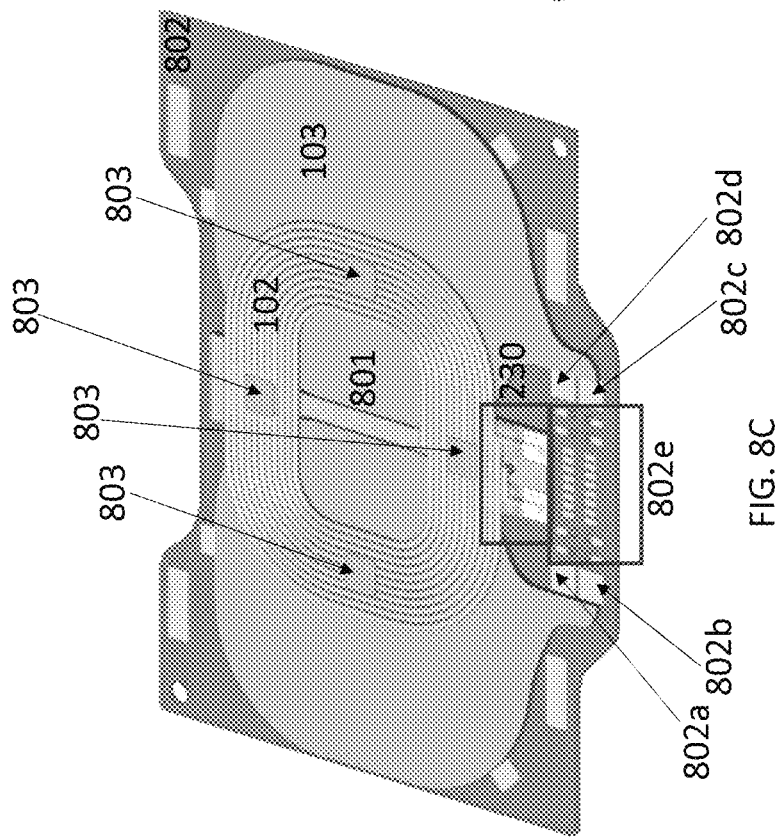
FIG. 8D
FIG. 8C

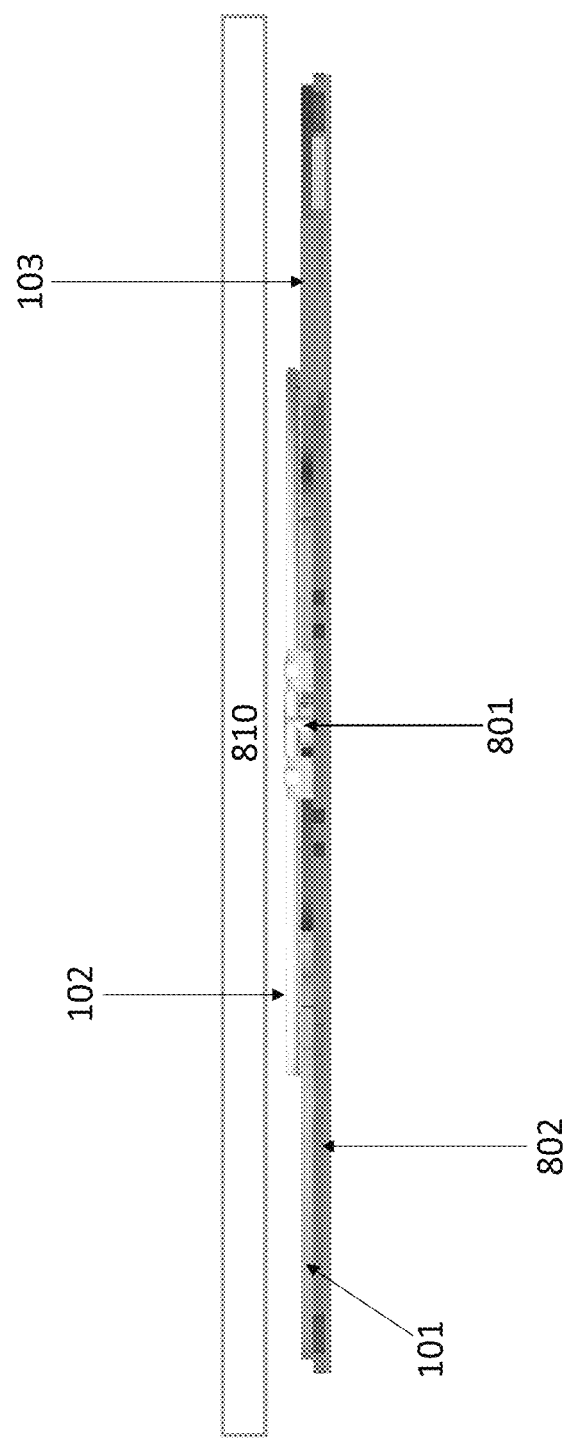

COIL STRUCTURE

CROSS-REFERENCE TO RELATED APPLICATION

The present application is a continuation application of U.S. application Ser. No. 16/821,014 filed on Mar. 17, 2020, now U.S. Pat. No. 11,791,079, which claims the benefit of U.S. Provisional Application Ser. No. 62/822,051 filed on Mar. 22, 2019, which is hereby incorporated by reference herein and made a part of the specification.

BACKGROUND OF THE INVENTION

I. Field of the Invention

The present invention relates to a coil structure, and in particular, to a coil structure in a wireless transmitter.

II. Description of Related Art

Conventional coil structure used in a wireless transmitter has a metal wire and at least one insulating layer encapsulating the metal wire, wherein a terminal part of the metal wire is exposed from the at least one insulating layer for electrically connecting with an external circuit. However, the position of the terminal part of the metal wire is not easily to be positioned firmly for going through a soldering process so as to electrically connect the terminal part of the metal wire to a pad, such as a SMT pad.

In addition, when the coil is going through a soldering process, winding turns of the coil may become loose and the relative positions of the winding turns may change, which may affect the stability of the structure as well as the performance of the coil.

Therefore, a better solution is needed to resolve the above-mentioned issues.

SUMMARY OF THE INVENTION

One objective of the present invention is to form a coating layer to encapsulate a terminal part of at least one insulating layer of a conductive wire forming a coil so that the terminal part of the metal wire exposed from the at least one insulating layer can be positioned while going through an automatic soldering process for electrically connecting with an external circuit.

One objective of the present invention is to form a coating layer to encapsulate a top surface of the winding turns of the coil so that the winding turns of the coil will not become loose when the coil is going through a soldering process to maintain the stability of the coil structure as well as the performance of the coil.

In one embodiment of the present invention, a coil is disclosed, wherein the coil is formed by a conductive wire comprising a metal wire and at least one insulating layer encapsulating the metal wire, wherein a first terminal part of the metal wire is exposed from the at least one insulating layer for electrically connecting to an external circuit and at least one portion of a first terminal part of the at least one insulating layer is encapsulated by a coating layer for positioning the first terminal part of the metal wire.

In one embodiment, a second terminal part of the metal wire is exposed from the at least one insulating layer for electrically connecting to an external circuit of the coil, and at least one portion of a second terminal part of the at least one insulating layer is encapsulated by a second coating layer for positioning the second terminal part of the metal wire.

In one embodiment, the coil is disposed on a magnetic sheet comprising ferrite.

In one embodiment, the first terminal part of the metal wire is used for soldering to a SMT pad.

In one embodiment, the first terminal part of the metal wire is soldered to a SMT pad on a top surface of a substrate, wherein an electrode is on a bottom surface of the substrate and electrically connecting to the SMT pad.

In one embodiment, the substrate is a PCB.

In one embodiment, the substrate comprises a magnetic body.

In one embodiment, the substrate is a magnetic sheet.

In one embodiment, the substrate is a magnetic sheet comprising ferrite.

In one embodiment, the substrate is a magnetic sheet comprising ferrite, wherein the magnetic sheet extends to a hollow space of the coil.

In one embodiment, the first terminal part of the metal wire is soldered to a SMT pad on a top surface of a substrate, wherein a pad is formed on a bottom surface of the substrate and electrically connecting to the SMT pad.

In one embodiment, the first terminal part of the metal wire is soldered to a SMT pad on a top surface of a substrate, and the SMT pad is electrically connecting with a through-hole pin extends out from a bottom surface of the substrate.

In one embodiment, the first terminal part of the metal wire is encapsulated by tin.

In one embodiment, the coil is disposed in a magnetic body, and the coating layer encapsulates the magnetic body.

In one embodiment, the coil is disposed in a magnetic body, and the coating layer encapsulates the magnetic body comprising ferrite.

In one embodiment, the at least one insulating layer comprising a first insulating layer and a self-adhesive layer encapsulating the first insulating layer, wherein the coating layer encapsulates the self-adhesive layer.

In one embodiment, the coating layer comprises at least one of the following materials: resin, silicone, acrylic, and plastic.

In one embodiment, the coating layer comprises thermosetting resin.

In one embodiment, the coating layer covers a top surface of a plurality of winding turns of the coil.

In one embodiment, the coating layer is formed by a plastic injection process.

In one embodiment, the coil is in a magnetic body.

In one embodiment, the coating layer covers a top surface of the magnetic body and the first portion of the at least one insulating layer.

In one embodiment of the present invention, a coil structure is disclosed, wherein the coil structure comprises a coil and a conductive terminal part, wherein the coil is formed by a conductive wire comprising a metal wire and at least one insulating layer encapsulating the metal wire, wherein a first terminal part of the metal wire is exposed from the at least one insulating layer, wherein a first portion of the conductive terminal part encapsulates a first terminal part of the metal wire and a second portion of the conductive terminal part extends from said first portion as an electrode for electrically connecting to an external circuit.

In one embodiment, the coating layer covers a top surface of the coil.

In one embodiment, a first portion of the conductive terminal part has a metal ring encapsulating the first terminal part of the metal wire.

In one embodiment, a first portion of the conductive terminal part has a metal groove encapsulating the first terminal part of the metal wire.

In one embodiment, the at least one insulating layer comprising a first insulating layer and a second insulating layer encapsulating the first insulating layer, wherein the coating layer encapsulates the self-adhesive layer.

In one embodiment, the at least one insulating layer comprising a first insulating layer and a self-adhesive layer encapsulating the first insulating layer, wherein the coating layer encapsulates the self-adhesive layer.

In one embodiment, the coating layer comprises at least one of the following materials: resin, silicone, and acrylic.

In one embodiment of the present invention, a coil is disclosed, the coil comprising a plurality of winding turns, wherein the coil is formed by a conductive wire comprising a metal wire and at least one insulating layer encapsulating the metal wire, wherein a first terminal part of the metal wire is exposed from the at least one insulating layer for electrically connecting to an external circuit, wherein a coating layer is coated on a top surface of the plurality of winding turns for fixing the relative portions of the plurality of winding turns.

In one embodiment of the present invention, a coil structure is disclosed, wherein the coil structure comprises a coil formed by a conductive wire and a flexible printed circuit board, wherein the flexible printed circuit board is disposed across a plurality winding turns of the coil, wherein a first terminal part and a second terminal part of the conductive wire are electrically connected to the flexible printed circuit board for electrically connecting to an external circuit.

In one embodiment, a first surface mount pad and a second surface mount pad of the flexible printed circuit board are electrically connected to the first terminal part and the second terminal part of the conductive wire for electrically connecting with an external circuit.

In one embodiment of the present invention, a coil structure used for a wireless transmitter is disclosed, wherein the coil structure comprises a first coil, a second coil and a third coil, wherein the first coil and the third coil are placed side by side on a top surface of a substrate and the second coil is disposed over the first coil and the third coil, wherein for each coil, the coil is formed by a conductive wire comprising a metal wire and at least one insulating layer encapsulating the metal wire, wherein a first terminal part of the metal wire is exposed from the at least one insulating layer for electrically connecting to an external circuit and a first portion of the at least one insulating layer adjacent to the first terminal part of the metal wire is encapsulated by a coating layer to strengthen the rigidity of the first portion of the at least one insulating layer for positioning the first terminal part of the metal wire.

In one embodiment of the present invention, a coil structure used for a wireless transmitter is disclosed, wherein the coil structure comprises a first coil formed by a conductive wire and a first substrate, wherein the first substrate is disposed across a plurality winding turns of the first coil, wherein a first terminal part and a second terminal part of the conductive wire are electrically connected to the first substrate for electrically connecting to an external circuit, wherein the width of the first substrate is less than that of the first coil.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3C depicts an enlarged cross-section view of two winding turns of the coil structure according to one embodiment of the present invention, wherein the coil has only one insulating layer;

FIG. 5A depicts an enlarged top view of a coil structure on a PCB according to one embodiment of the present invention;

FIG. 5B-5F depicts different pin structures of the coil structure in FIG. 5A according to one embodiment of the present invention;

FIG. 8C an enlarged top view of a coil structure according to another embodiment of the present invention;

FIG. 8D an enlarged bottom view of a coil structure according to another embodiment of the present invention;

FIG. 8E an enlarged top view of a coil structure according to another embodiment of the present invention;

DESCRIPTION OF EMBODIMENTS

Figure 1:
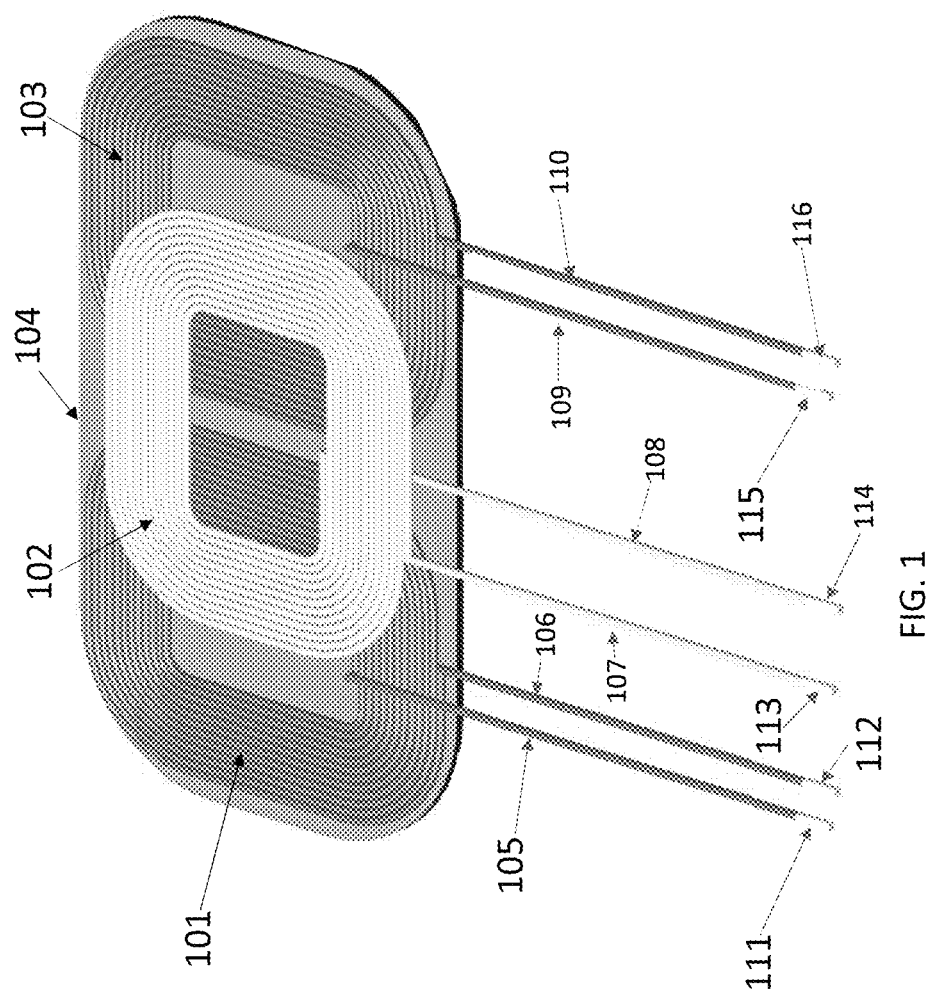
FIG. 1 depicts an enlarged top view of a coil according to one embodiment of the present invention.

FIG. 1 depicts an enlarged top view of a coil structure of a wireless transmitter, wherein a coil structure comprises a first coil 101 and a third coil 103 on a substrate and a second coil 102 on the first coil 101 and the third coil 103, wherein the first coil 101 is formed by a conductive wire comprising a metal wire and at least one insulating layer encapsulating the metal wire, wherein a first terminal part 111 of the metal wire of the first coil 101 is exposed from the at least one insulating layer 105 and a second terminal part 112 of the metal wire of the first coil 101 is exposed from the at least one insulating layer 106; the second coil 102 is formed by a conductive wire comprising a metal wire and at least one insulating layer encapsulating the metal wire, wherein a first terminal part 113 of the metal wire of the second coil 102 is exposed from the at least one insulating layer 107 and a second terminal part 114 of the metal wire of the second coil 102 is exposed from the at least one insulating layer 108; and the third coil 103 is formed by a conductive wire comprising a metal wire and at least one insulating layer encapsulating the metal wire, wherein a first terminal part 115 of the metal wire of the third coil 103 is exposed from the at least one insulating layer 109 and a second terminal part 116 of the metal wire of the third coil 103 is exposed from the at least one insulating layer 110. In one embodiment, the second coil 102 can be disposed on a magnetic sheet 104 comprising ferrite, as shown in FIG. 1. In one embodiment, the first coil 101, the second coil 102 and the third coil 103 can be disposed on a magnetic sheet 104 comprising ferrite, as shown in FIG. 1.

Figure 2A:
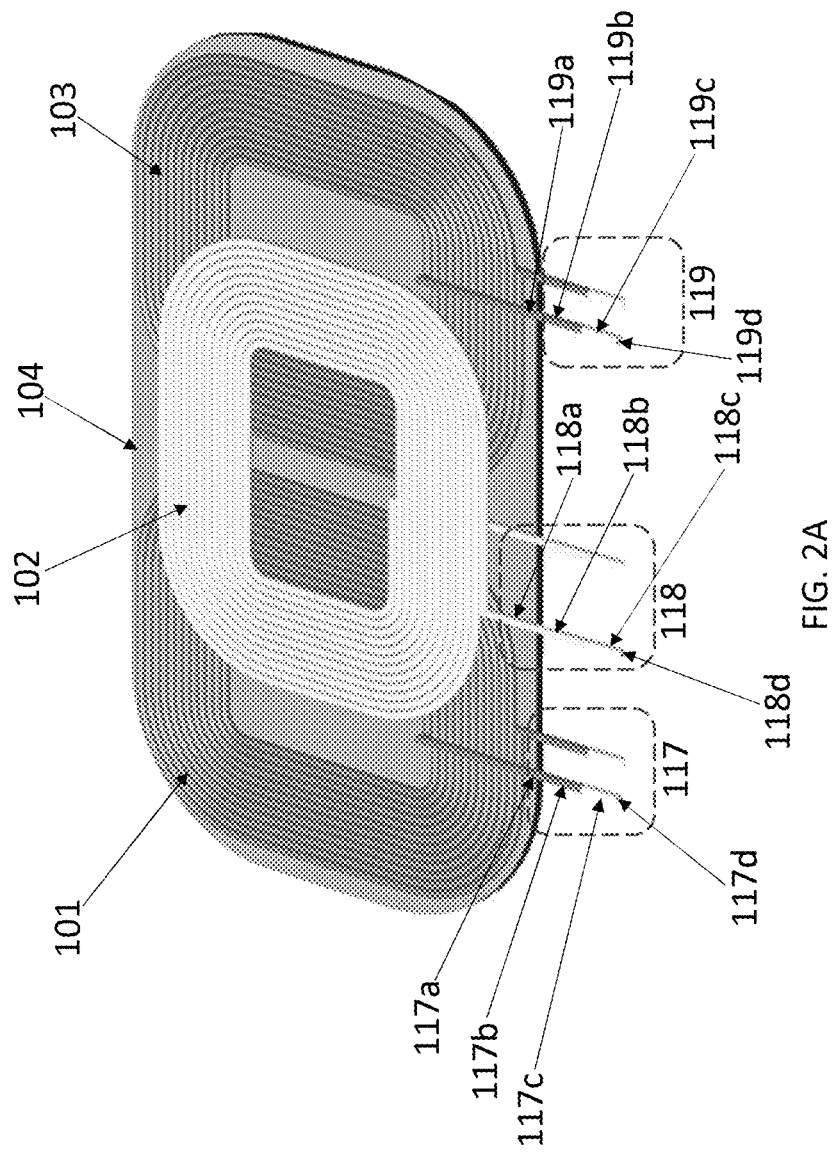
FIG. 2A depicts an enlarged top view of a coil structure according to one embodiment of the present invention.

FIG. 2A shows that the rigidity of the terminal parts in regions 117, 118, 119 of the coils of FIG. 1 can be strengthen by adding a coating layer on the portions of the insulating layers of the terminal parts in the regions 117, 118, 119, for soldering to an external circuit, wherein a first portion 117a of a terminal part of the insulating layers is disposed on a magnetic sheet 104, and a second portion 117b of a terminal part of the insulating layers is located outside the magnetic sheet 104, wherein the first portion 117a and the second portion 117b of the terminal part of the insulating layers are encapsulated by a corresponding coating layer, and a terminal part 117c of the metal wire of the coil 101 has an endpoint 117d of the metal wire of the coil 101; a first portion 118a of a terminal part of the insulating layers is disposed on the magnetic sheet 104, and a second portion 118b of a terminal part of the insulating layers is located outside the magnetic sheet 104, wherein the first portion 118a and the second portion 118b of the terminal part of the insulating layers are encapsulated by a corresponding coating layer, and a terminal part 118c of the metal wire of the coil 102 has an endpoint 118d of the metal wire of the coil 102; and a first portion 119a of a terminal part of the insulating layers is disposed on the magnetic sheet 104, and a second portion 119b of a terminal part of the insulating layers is located outside the magnetic sheet 104, wherein only the second portion 119b of the terminal part of the insulating layers is encapsulated by a corresponding coating layer, and a terminal part 119c of the metal wire of the coil 103 has an endpoint 119d of the metal wire of the coil 103.

Figure 2B:
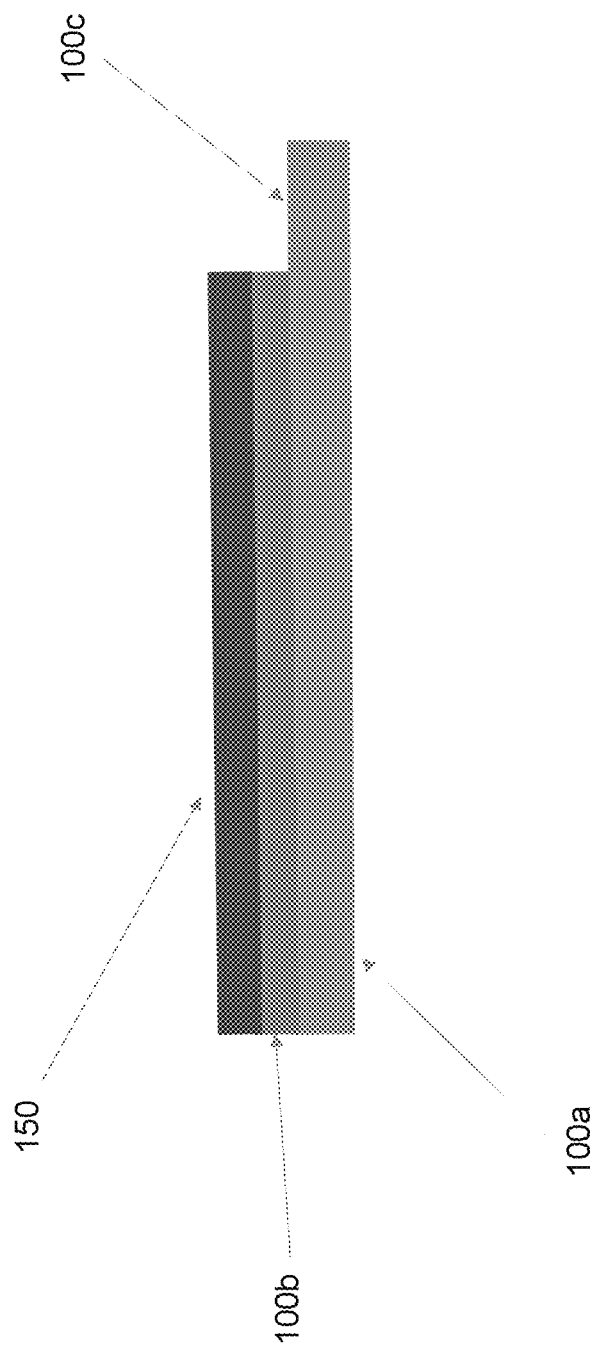
FIG. 2B depicts an enlarged cross-section view of the coil structure of FIG. 2A according to one embodiment of the present invention, wherein the coil has only one insulating layer.

FIG. 2B depicts an enlarged cross-section view of a terminal part of a coil along the axis of the conductive wire of the coil. As shown in FIG. 2B, a first terminal part 100c of the metal wire 100a of the coil is exposed from the at least one insulating layer for electrically connecting to an external circuit, and a first terminal part 100b of the at least one insulating layer of the coil is encapsulated by a coating layer 150 for positioning the first terminal part 100c of the metal wire 100a. The coating layer 150 can be used to strengthen the rigidity of the first terminal part 100b, so that the first terminal part 100c of the metal wire 100a can be positioned firmly for soldering to an external circuit of the coil 102, such as a pad or pin on a substrate such as a PCB.

Figure 2C:
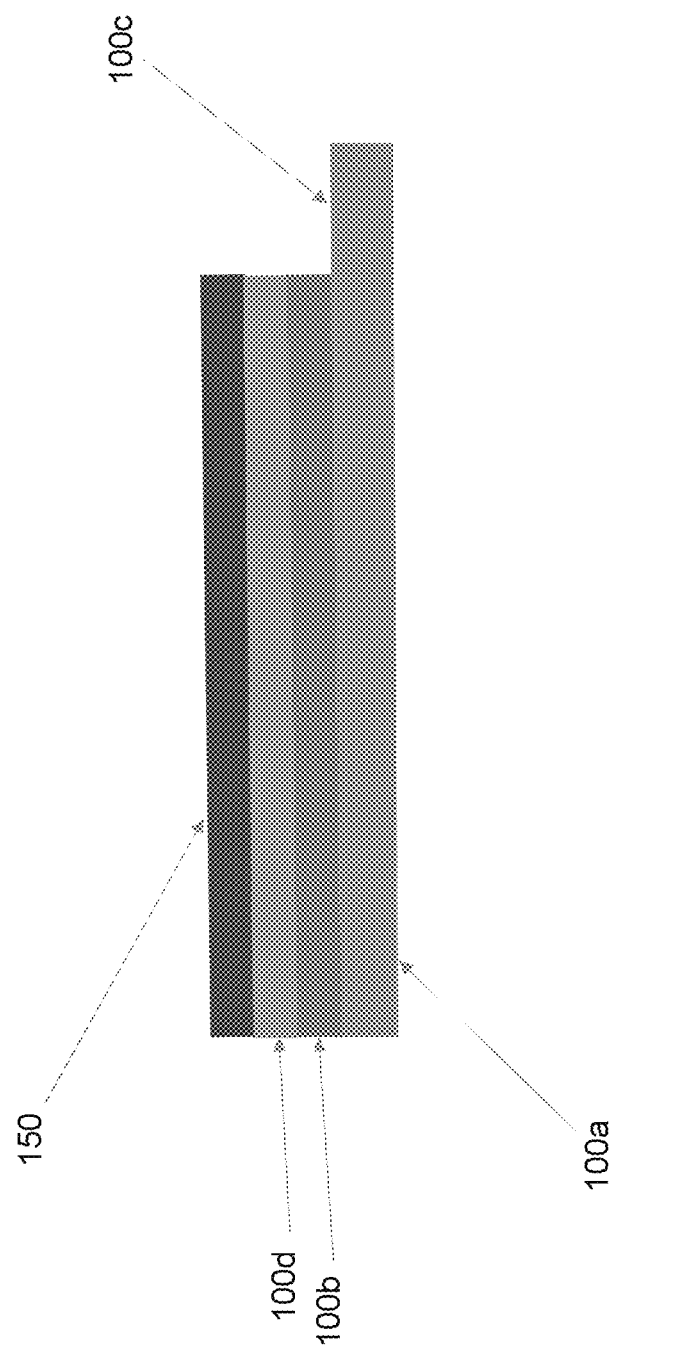
FIG. 2C depicts an enlarged cross-section view of the coil structure of FIG. 2A according to one embodiment of the present invention, wherein the coil has two insulating layers.

FIG. 2C depicts an enlarged cross-section view of a terminal part of a coil along the axis of the conductive wire of the coil. As shown in FIG. 2C, a first terminal part 100c of the metal wire 100a is exposed from the two insulating layers for electrically connecting to an external circuit, and the terminal parts 100b, 100d of the two insulating layers are encapsulated by a coating layer 150 for positioning the first terminal part 100c of the metal wire 100a. The coating layer 150 can be used to strengthen the rigidity of the terminal parts 100b, 100d of the two insulating layers, so that the first terminal part 100c of the metal wire 100a can be positioned firmly for soldering to an external circuit. The insulating layer 100d can be a self-adhesive layer.

In one embodiment, the coil 102 is disposed in a wireless transmitter.

In one embodiment, the first terminal part 100c of the metal wire 100a is used for soldering to a SMT pad.

In one embodiment, the first terminal part 100c of the metal wire 100a is soldered to a SMT pad on a top surface of a substrate, wherein an electrode is on a bottom surface of the substrate and electrically connecting to the SMT pad.

In one embodiment, the substrate is a PCB.

In one embodiment, the substrate is a magnetic sheet comprising ferrite.

In one embodiment, the first terminal part 100c of the metal wire 100a is soldered to a SMT pad on a top surface of a substrate, wherein a pad is formed on a bottom surface of the substrate and electrically connecting to the SMT pad.

In one embodiment, the first terminal part 100c of the metal wire 100a is soldered to a SMT pad on a top surface of a substrate, and the SMT pad is electrically connecting with a through-hole pin extends out from a bottom surface of the substrate.

In one embodiment, the first terminal part 100c of the metal wire 100a is made of copper and is encapsulated by tin.

In one embodiment, the coil 102 is disposed in a magnetic body, and the coating layer 150 encapsulates the magnetic body.

In one embodiment, the coil 102 is disposed in a magnetic body, and the coating layer 150 encapsulates the magnetic body comprising ferrite.

In one embodiment, the at least one insulating layer comprising a first insulating layer and a self-adhesive layer encapsulating the first insulating layer, wherein the coating layer 150 encapsulates the self-adhesive layer.

In one embodiment, the coating layer comprisesat least one of the following materials: resin, silicone, acrylic, and plastic.

In one embodiment, the coating layer comprises thermosetting resin.

In one embodiment, the coating layer covers a top surface of the coil and the first portion of the at least one insulating layer.

In one embodiment, the coating layer is formed by a plastic injection process.

In one embodiment, the winding turns of the coil are in a magnetic body.

In one embodiment, the coating layer covers a top surface of the magnetic body and the first portion of the at least one insulating layer.

Figure 3A:
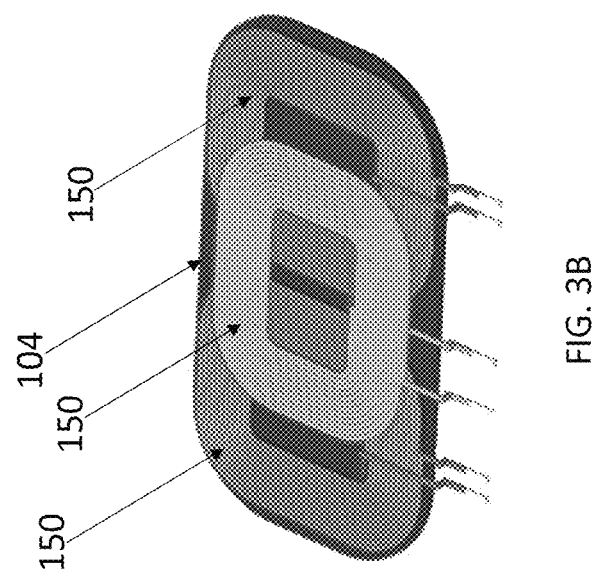
FIG. 3A depicts an enlarged top view of a coil structure according to one embodiment of the present invention.
Figure 3B:
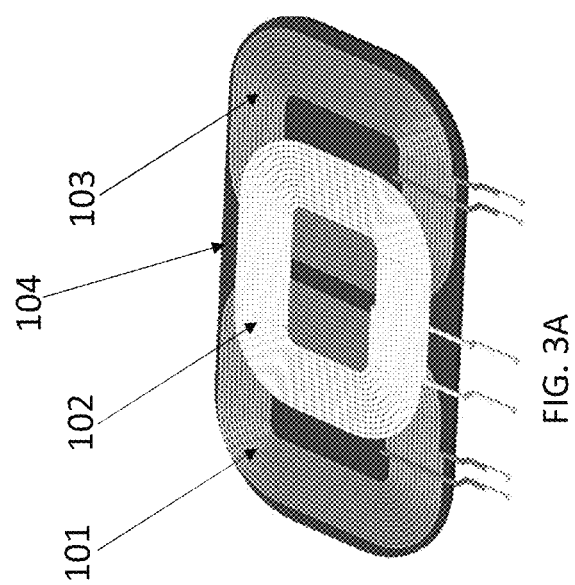
FIG. 3B depicts an enlarged top view of a coil structure according to one embodiment of the present invention, wherein a coating layer is disposed on a top surface the coil.

Please refer to FIG. 3A-3B. FIG. 3B depicts an enlarged top view of a coil structure, wherein each coil 101, 102, 103 of FIG. 3A has a plurality of winding turns, and the top surface of each coil 101, 102, 103 is encapsulated by a corresponding coating layer 150, as shown in FIG. 3B, so as to fix the relative positions of the plurality of winding turns of the coil. By doing so, each two adjacent winding turns of the coil will not become loose when the coil is under a soldering process, such as a SMT soldering process.

FIG. 3C depicts a cross-section view of two adjacent winding turns WT1, WT2 of the coil perpendicular to the axis of the conductive wire 100a of the coil. As shown in FIG. 3C, the coil is formed by a conductive wire comprising a metal wire 100a and at least one insulating layer 300b encapsulating the metal wire 100a, and the two adjacent winding turns WT1, WT2 of the coil are separated by a horizontal gap 320.

Figure 3D:
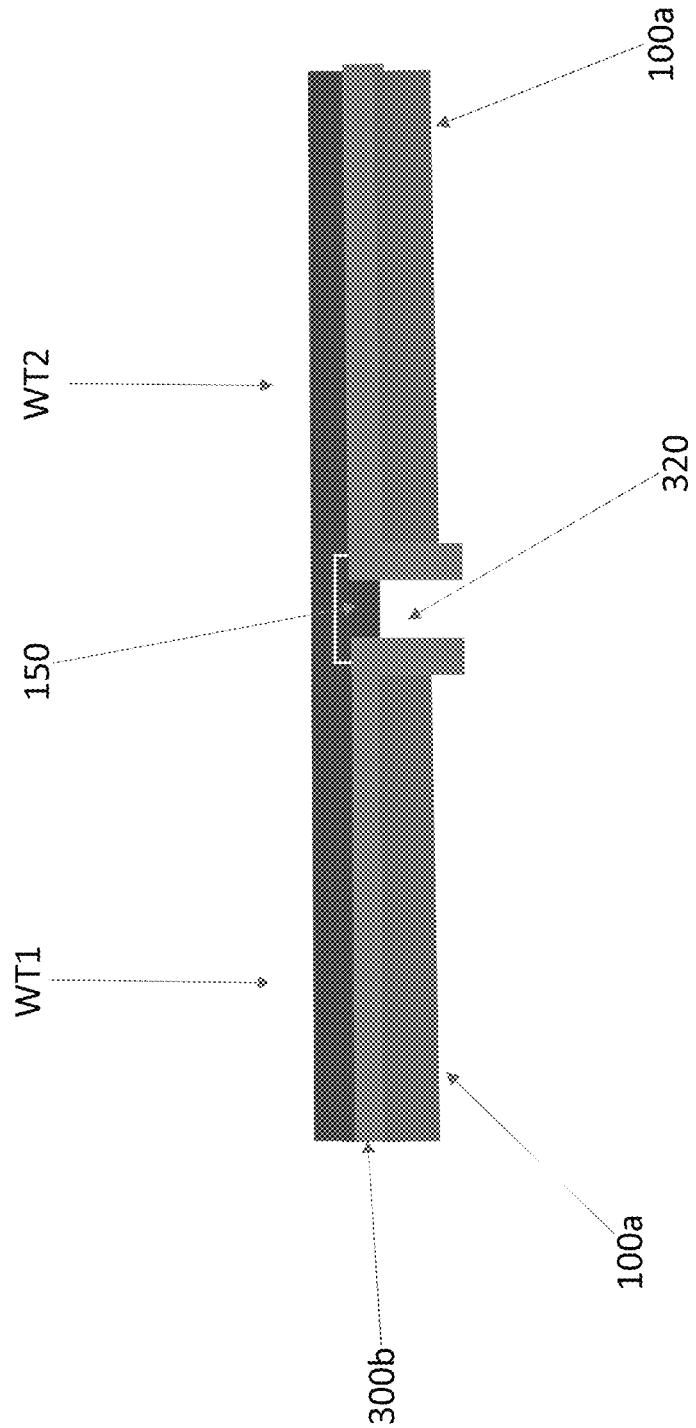
FIG. 3D depicts an enlarged cross-section view of adjacent winding turns of the coil structure according to one embodiment of the present invention, wherein the coil has only one insulating layer and a coating layer is disposed on a top surface the winding turns of the coil.

As shown in FIG. 3D, the top surface of the coil is encapsulated by a coating layer 150 so as to fix the relative positions of the winding turns WT1, WT2 of the coil. In one embodiment, the coating layer 150 is extended into the horizontal gap 320.

Figure 3E:
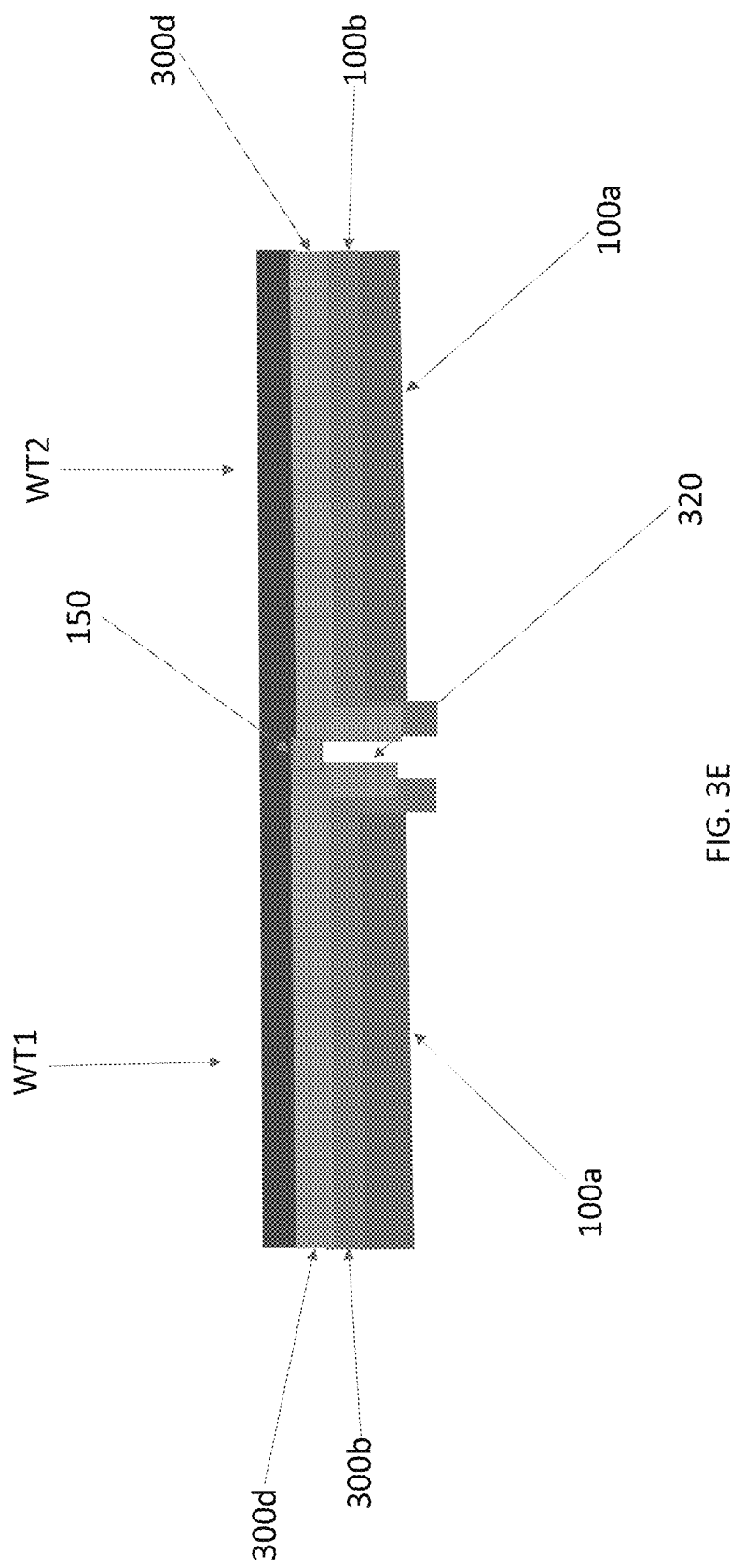
FIG. 3E depicts an enlarged cross-section view of adjacent winding turns of the coil structure according to one embodiment of the present invention, wherein the coil has two insulating layers and a coating layer is disposed on a top surface the winding turns of the coil.

FIG. 3E depicts a cross-section view of two adjacent winding turns WT1, WT2 of a coil perpendicular to the axis of the conductive wire of the coil. As shown in FIG. 3E, the coil is formed by a conductive wire comprising a metal wire 100a and two insulating layers 300b, 300d encapsulating the metal wire 100a, wherein the two adjacent winding turns WT1, WT2 of the coil are separated by a horizontal gap 320, and the coating layer 150 is disposed on the top surface of the winding turns WT1, WT2 of the coil so as to fix the relative positions of the winding turns WT1, WT2 of the coil. In one embodiment, the coating layer 150 is extended into the horizontal gap 320.

Figure 4B:
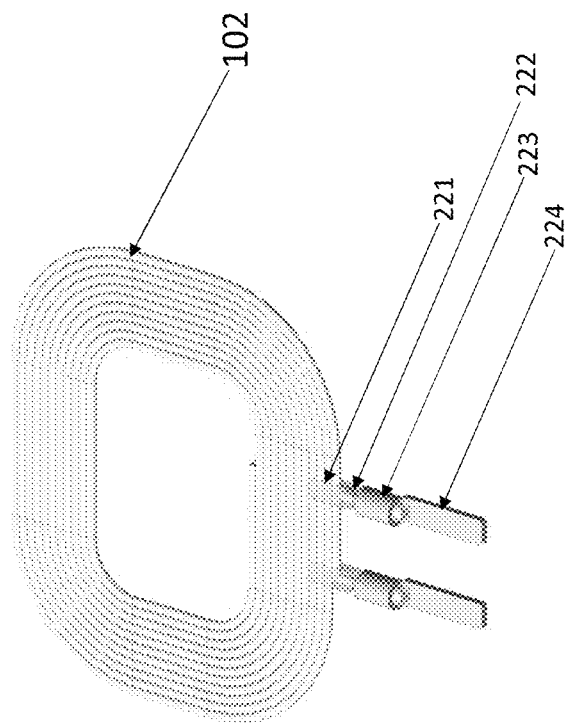
FIG. 4B depicts an enlarged top view of the electrodes of the coil structure in FIG. 4A according to one embodiment of the present invention.
Figure 4A:
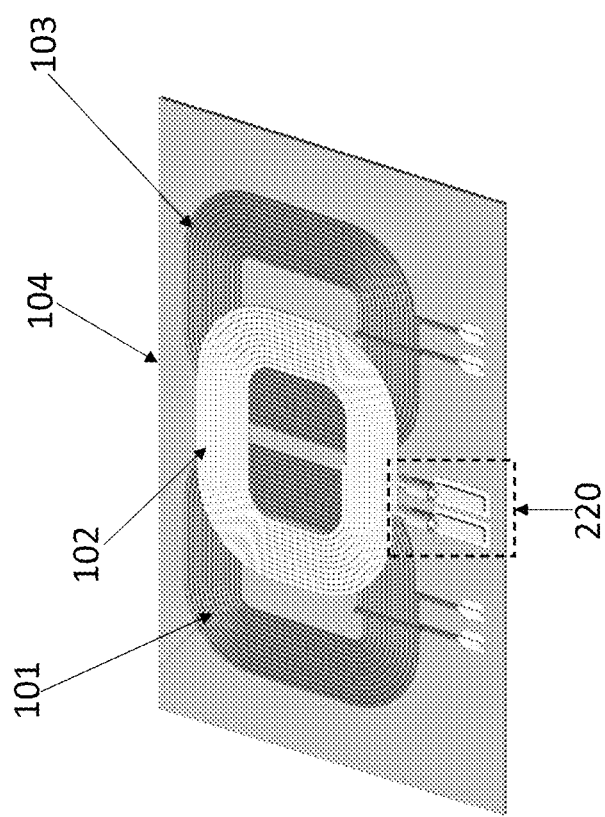
FIG. 4A depicts an enlarged top view of a coil structure on a PCB according to one embodiment of the present invention.
Figure 4C:
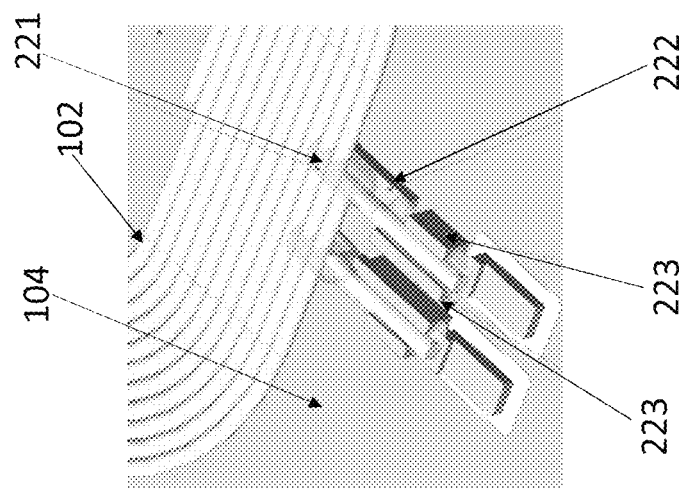
FIG. 4C depicts an enlarged top view of the electrodes of the coil structure in FIG. 4A according to one embodiment of the present invention.

Please refer to FIG. 4A-4C. FIG. 4A depicts an enlarged top view of a coil structure according to one embodiment of the present invention. Instead of using the coating layer 150 to strengthen the rigidity of the terminal part of the coil, a conductive terminal part 220 is used for positioning the terminal part of the metal wire. As shown in FIG. 4B, a first portion 223 of the conductive terminal part 220 encapsulates a first terminal part 100c of the metal wire 100a and a second portion 224 of the conductive terminal part 220 extends from said first portion 223 as an electrode for electrically connecting to an external circuit. In one embodiment, the conductive terminal part 220 has a third portion 222 that is adhered to the coil 102 by using an adhesive material 221. The first portion 223 of the conductive terminal part 220 can have different shapes. In one embodiment, the first portion 223 of the conductive terminal part 220 has a ring shape as shown in FIG. 4B. In one embodiment, the first portion 223 of the conductive terminal part 220 has a groove shape as shown in FIG. 4C.

In one embodiment, a coating layer 150 covers a top surface of the coil.

In one embodiment, the first portion 223 of the conductive terminal part has a metal ring encapsulating the first terminal part of the metal wire.

In one embodiment, the first portion 223 of the conductive terminal part has a metal groove encapsulating the first terminal part of the metal wire.

In one embodiment, the at least one insulating layer of the coil 102 comprises a first insulating layer and a self-adhesive layer encapsulating the first insulating layer, wherein the coating layer 150 encapsulates the self-adhesive layer.

In one embodiment, the coating layer 150 comprises at least one of the following materials: resin, silicone, and acrylic.

In one embodiment, the coating layer 150 comprises thermosetting resin.

FIG. 5A depicts an enlarged top view of a coil structure according to one embodiment of the present invention, the coil structure of FIG. 1 is disposed on a PCB for forming a wireless transmitter, wherein a first terminal part 100c of the metal wire 100a of the coil 102 is soldered to a contact point 201 on a top surface of the PCB 200 and different electrode structures can be formed for electrically connecting to an external circuit.

FIG. 5B depicts an enlarged top view of an electrode structure of the coil 102 according to one embodiment of the present invention, wherein a first terminal part 100c of the metal wire 100a of the coil 102 is soldered to a contact point 201 on a top surface of the PCB 200 and a through-hole pin 202 is disposed in the PCB 200, for electrically connecting to an external circuit.

FIG. 5C depicts an enlarged top view of an electrode structure of the coil 102 according to one embodiment of the present invention, wherein a first terminal part 100c of the metal wire 100a of the coil 102 is soldered to a contact point 201 on a top surface of the PCB 200 and a pad 203 is on a bottom surface of the PCB 200, wherein the pad 203 is electrically connected to the first terminal part 100c of the metal wire 100a of the coil 102 through a via disposed in the PCB 200, for electrically connecting to an external circuit.

FIG. 5D depicts an enlarged top view of an electrode structure of the coil 102 according to one embodiment of the present invention, wherein a first terminal part 100c of the metal wire 100a of the coil 102 is soldered to a contact point 201 on a top surface of the PCB 200 and a pad 204 is on a bottom surface of the PCB 200, wherein the pad 204 is electrically connected to the first terminal part 100c of the metal wire 100a of the coil 102 through a via disposed in the PCB 200, for electrically connecting to an external circuit.

FIG. 5E depicts an enlarged top view of an electrode structure of the coil 102 according to one embodiment of the present invention, wherein a first terminal part 100c of the metal wire 100a of the coil 102 is soldered to a contact point 201 on a top surface of the PCB 200 and a through-hole pin 205 is disposed in the PCB 200, for electrically connecting to an external circuit.

FIG. 5F depicts an enlarged top view of an electrode structure of the coil 102 according to one embodiment of the present invention, wherein a first terminal part 100c of the metal wire 100a of the coil 102 is soldered to a contact point 201 on a top surface of the PCB 200 and a pin 206 is disposed in the PCB 200 and extended on a lateral side, for electrically connecting to an external circuit.

Figure 6A:
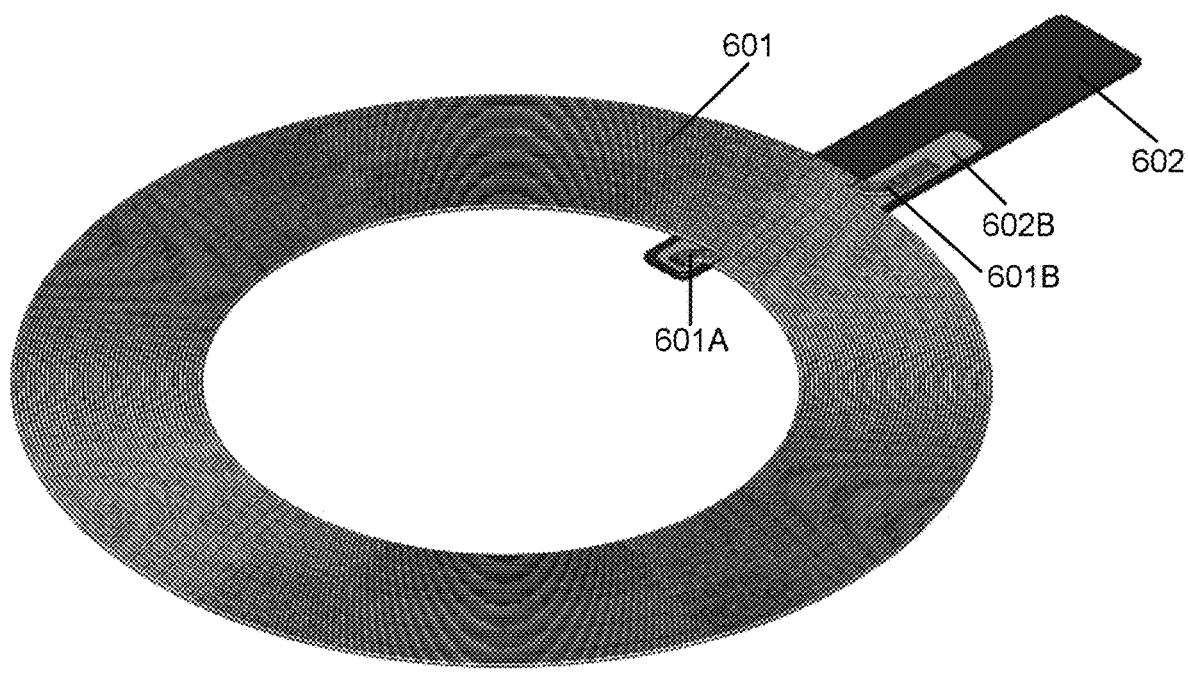
FIG. 6A-6B depicts an enlarged top view of a coil structure according to one embodiment of the present invention.
Figure 6B:
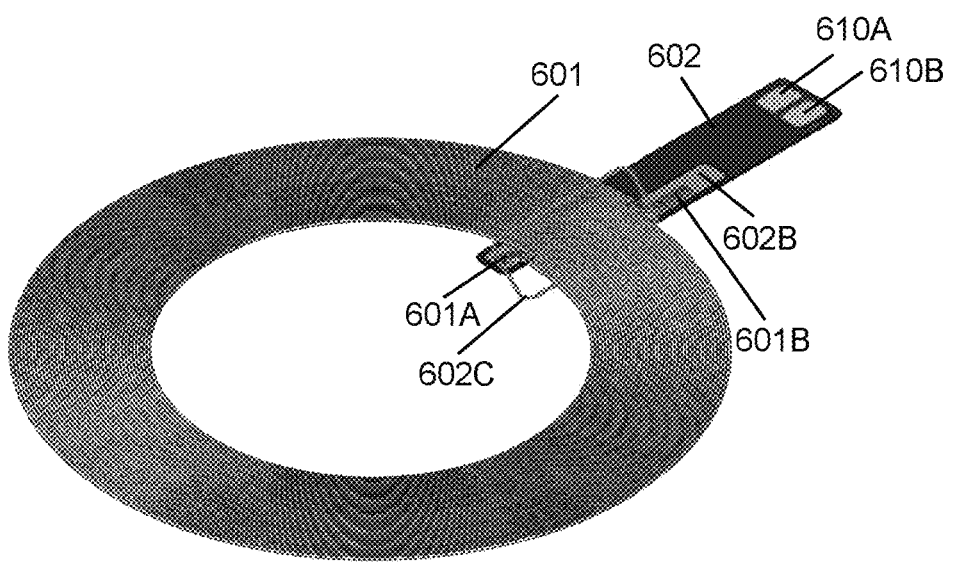

FIG. 6A depicts an enlarged top view of a coil structure according to one embodiment of the present invention, wherein the coil structure comprises a coil 601 made of a conductive wire and a flexible printed circuit board (FPC) 602, wherein the flexible printed circuit board 602 is disposed across the plurality turns of the coil 601, wherein a first terminal part 601A and a second terminal part 601B of the conductive wire are electrically connected to conductive patterns 602B on the flexible printed circuit board 602 for electrically connecting to an external circuit. In one embodiment, as shown in FIG. 6B, a first surface mount pad 610A and a second surface mount pad 610B are electrically connected to the first terminal part 601A and the second terminal part 601B of the conductive wire for electrically connecting with an external circuit, such as a PCB via a SMT soldering process.

There are many ways to dispose the flexible printed circuit board 602C under the coil 601. The region structure 602C FIG. 6B will be described hereafter.

Figure 6C:
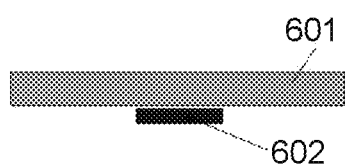
FIG. 6C-6F depicts ways to connect a FPC to the coil in FIG. 6A and FIG. 6B.

In one embodiment, the flexible printed circuit board 602 is disposed under the bottom surface of the coil, as shown in FIG. 6C.

Figure 6D:
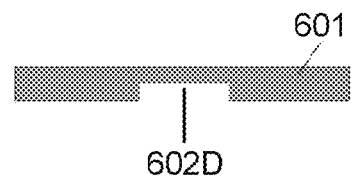

In one embodiment, the flexible printed circuit board 602 is disposed in a recess 602D formed on the bottom surface of the coil, as shown in FIG. 6D.

Figure 6E:
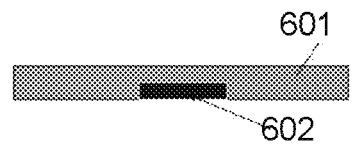

In one embodiment, the flexible printed circuit board 602 is entirely disposed in the recess 602D formed on the bottom surface of the coil, as shown in FIG. 6E.

Figure 6F:
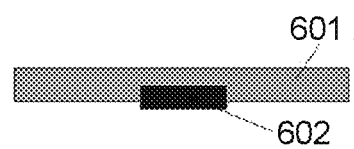

In one embodiment, the flexible printed circuit board 602 is partially disposed in the recess 602D formed on the bottom surface of the coil, as shown in FIG. 6F.

Figure 7A:
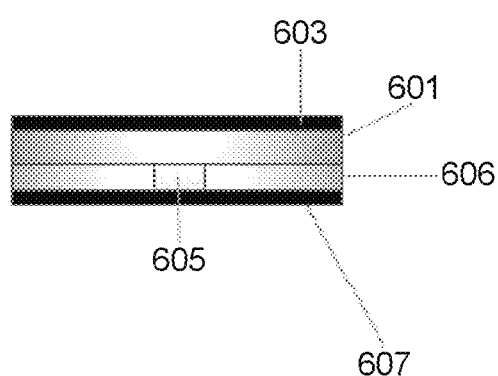
FIG. 7A depicts an enlarged top view of a coil structure according to one embodiment of the present invention.

In one embodiment, as shown in FIG. 7A, a magnetic sheet 606 is disposed on a bottom surface of the coil 601, and the flexible printed circuit board 602 is encapsulated by the magnetic sheet 606.

In one embodiment, the magnetic sheet 606 is disposed on a bottom surface of the coil 601, and the flexible printed circuit board 602 is disposed in a through opening 605 formed in the magnetic sheet 606, as shown in FIG. 7A.

Figure 7B:
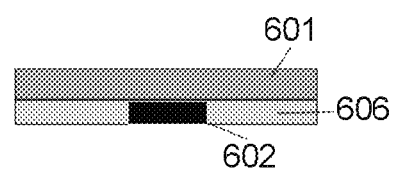
FIG. 7B-7C depicts ways to connect a FPC to the coil in FIG. 7A.

In one embodiment, the magnetic sheet 606 is disposed on a bottom surface of the coil 601, and the flexible printed circuit board 602 is disposed in a recess 602 formed on the bottom surface of the magnetic sheet 606, as shown in FIG. 7B.

In one embodiment, a first adhesive tape 607 is disposed on a bottom surface of the magnetic sheet 606, as shown in FIG. 7A.

In one embodiment, the first adhesive tape is a PET tape.

In one embodiment, the first adhesive tape is a Graphite tape.

In one embodiment, a second adhesive tape 603 is disposed on a bottom surface of the magnetic sheet 606, as shown in FIG. 7A.

In one embodiment, the second adhesive tape is a PET tape.

In one embodiment, the second adhesive tape is a Graphite tape.

Figure 7C:
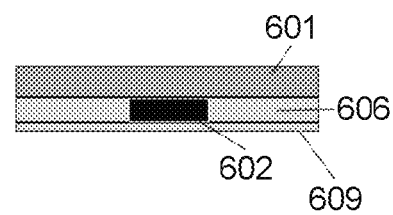

In one embodiment, another magnetic sheet 609 is disposed on a bottom surface of the magnetic sheet 606, as shown in FIG. 7C.

Using the thin flexible printed circuit board to connect the coil to an external circuit can achieve the purpose of not occupying the thickness of a finished product. Since the flexible circuit board (FPC) can be manufactured by a semiconductor process, it is easier to control the layout of the circuit or the size or positions of the pads for electrically connecting with an external circuit.

Figure 8B:
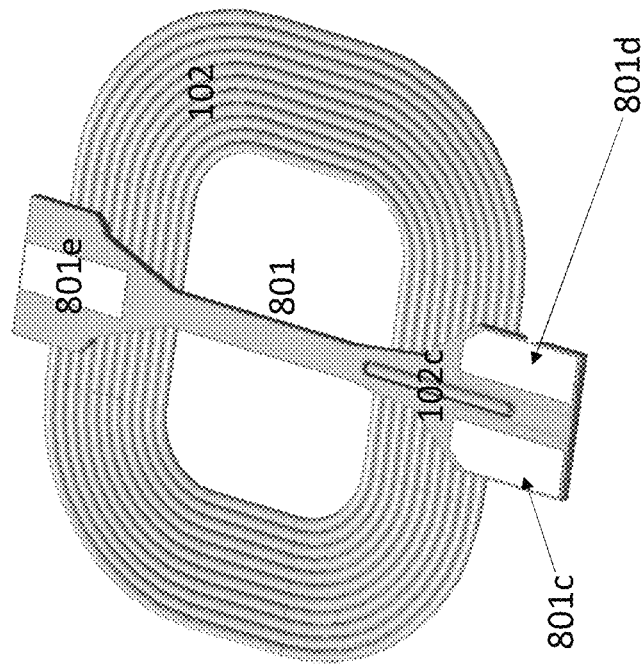
FIG. 8B depicts an enlarged bottom view of a coil structure according to one embodiment of the present invention.
Figure 8A:
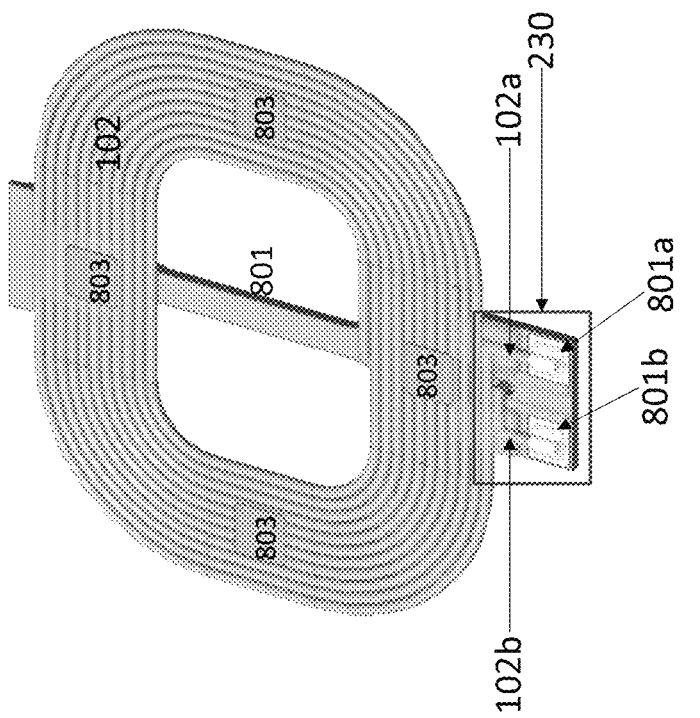
FIG. 8A depicts an enlarged top view of a coil structure according to one embodiment of the present invention.

FIG. 8A depicts an enlarged top view of a coil structure according to one embodiment of the present invention, wherein the coil structure comprises a second coil 102 formed by a conductive wire and a first substrate 801, wherein the first substrate 801 is disposed across a plurality winding turns of the second coil 102, wherein a first terminal part 102a and a second terminal part 102b of the conductive wire are electrically connected to the first substrate 801, wherein the width of the first substrate 801 is less than the width of the second coil 102. Please note that the width of the first substrate 801 and the width of the second coil 102 are measured along a horizontal line passing the center of the second coil 102, when looking at the top view of FIG. 8A.

In one embodiment, the first substrate 801 is a printed circuit board.

In one embodiment, as shown in block 230 of FIG. 8A, a first surface mount pad 801a and a second surface mount 801b pad are on a top surface of the first substrate 801 and electrically connected to the first terminal part 102a and the second terminal part 102b of the conductive wire, respectively.

FIG. 8B depicts an enlarged bottom view of the coil structure according to one embodiment of the present invention, wherein another portion 102c of the conductive wire is disposed on a bottom surface of the first substrate 801 and the second terminal part 102b of the conductive wire is disposed on a top surface of the substrate 801.

In one embodiment, said another portion 102c of the conductive wire and the second terminal part 102b of the conductive wire can be traces on the substrate 801 instead of being part of the conductive wire, at this time, the second terminal part 102b of the conductive wire is located at inner side of the second coil 102 and said traces on the substrate 801 can electrically connect the second terminal part 102b to the pad 801b on the top surface of the the substrate 801.

In one embodiment, as shown in FIG. 8B, said another portion 102c of the conductive wire is extended to the second terminal part 102b via through holes in the first substrate 801.

In one embodiment, as shown in FIG. 8B, a third surface mount pad 801c and a fourth surface mount 801d pad are on a bottom surface of the first substrate 801 and electrically connected to the first terminal part 102a and the second terminal part 102b of the conductive wire, respectively.

In one embodiment, as shown in FIG. 8B, a fifth surface mount pad 801e is on a bottom surface of the first substrate 801.

FIG. 8C an enlarged top view of a coil structure according to another embodiment of the present invention; and FIG. 8D an enlarged bottom view of a coil structure according to another embodiment of the present invention.

In one embodiment, the coil structure, as shown in FIG. 8C and FIG. 8D, is used for a wireless transmitter of a wireless charger.

In one embodiment, as shown in FIG. 8C, the coil structure further comprising a first coil 101 and a third coil 103, wherein the first coil 101 and the third coil 103 are disposed over the second substrate 802, and the second coil 102 is disposed over the first coil 101 and the third coil 103, wherein the second coil 102 is adhered to the first coil 101 and the third coil 103 by an adhesive material 803, wherein the surface mount pads 801c and 801d in FIG. 8B are electrically connected to the second substrate 802.

In one embodiment, the second substrate 802 is a printed circuit board.

In one embodiment, the second substrate 802 comprises a plurality pads 802a, 802b, 802c, 802d on a top surface of the second substrate 802 for mounting devices.

In one embodiment, the second substrate 802 comprises a plurality pads within a block 802e on a top surface of the second substrate 802 for mounting devices.

FIG. 8E an enlarged top view of a coil structure according to another embodiment of the present invention, wherein a magnetic sheet 810 is disposed over the second coil 102, the first coil 101, the third coil 103 and the first substrate 801 and the second substrate 802.

Although the present invention has been described with reference to the above embodiments, it will be apparent to one of ordinary skill in the art that modifications to the described embodiment may be made without departing from the spirit of the invention. Accordingly, the scope of the invention will be defined by the attached claims, not by the above-detailed descriptions.

What is claimed is:

1. A coil structure comprises a first coil, a second coil, a third coil and a conductive terminal part, wherein the second coil is formed by a conductive wire comprising a metal wire and at least one insulating layer encapsulating the metal wire, wherein a first terminal part of the metal wire is exposed from the at least one insulating layer, wherein a first portion of the conductive terminal part encapsulates the first terminal part of the metal wire and a second portion of the conductive terminal part extends from said first portion as an electrode for electrically connecting to an external circuit, wherein the first coil and the third coil are disposed on a substrate, wherein the second coil is disposed on the first coil and the third coil.

2. The coil structure according to claim 1, wherein the first portion of the conductive terminal part has a ring shape encapsulating the first terminal part of the metal wire.

3. The coil structure according to claim 1, wherein the first portion of the conductive terminal part has a groove shape encapsulating the first terminal part of the metal wire.

\* \* \* \* \*